United States Patent
Yanamaka et al.

(10) Patent No.: US 7,415,373 B2
(45) Date of Patent: Aug. 19, 2008

(54) METHOD OF MEASURING FREQUENCY TRANSLATION DEVICE

(75) Inventors: Haruhiko Yanamaka, Kobe (JP); Yasuaki Komatsu, Kobe (JP)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/159,681

(22) Filed: Jun. 23, 2005

(65) Prior Publication Data

US 2006/0004919 A1 Jan. 5, 2006

(30) Foreign Application Priority Data

Jul. 5, 2004 (JP) ............... 2004-197840

(51) Int. Cl.
*G01R 23/00* (2006.01)
*G06F 19/00* (2006.01)

(52) U.S. Cl. ...................................... 702/75
(58) Field of Classification Search .................... 702/75
See application file for complete search history.

(56) References Cited

U.S. PATENT DOCUMENTS

| | | | | |
|---|---|---|---|---|
| 6,064,694 | A * | 5/2000 | Clark et al. ................. | 374/224 |
| 6,448,786 | B1 | 9/2002 | Dunsmore et al. .......... | 324/601 |
| 6,529,844 | B1 * | 3/2003 | Kapetanic et al. ............ | 702/85 |
| 6,608,475 | B2 * | 8/2003 | Gumm .................... | 324/76.53 |
| 6,690,722 | B1 | 2/2004 | Dunsmore et al. .......... | 375/224 |
| 6,904,381 | B2 * | 6/2005 | Shank et al. ................. | 702/108 |
| 7,002,335 | B2 * | 2/2006 | Shoulders ................. | 324/76.23 |
| 7,095,989 | B2 * | 8/2006 | Karlquist ................. | 455/127.1 |
| 2002/0121892 | A1 * | 9/2002 | Vandersteen et al. ........ | 324/118 |
| 2005/0271164 | A1 * | 12/2005 | Moulthrop et al. .......... | 375/332 |
| 2006/0084426 | A1 * | 4/2006 | Anderson et al. ........... | 455/423 |

FOREIGN PATENT DOCUMENTS

| | | |
|---|---|---|
| DE | 101 54 511 | 7/2002 |
| JP | 2002-57530 | 2/2002 |
| JP | 2002-202331 | 7/2002 |

OTHER PUBLICATIONS

German Patent and Trademark Office Search Report for German Patent Application No. 10 2005 030 221.1, dated May 4, 2006.

* cited by examiner

*Primary Examiner*—Michael P. Nghiem
*Assistant Examiner*—Cindy H Khuu

(57) ABSTRACT

A method for measuring a frequency translation device under test by using a vector network analyzer and a reference frequency translation device that includes measuring the network characteristics of the reference frequency translation device by using the vector network analyzer, measuring the network characteristics of a circuit including the reference frequency translation device and the frequency translation device under test by using the vector network where the reference frequency translation device has an operation complementary to the frequency translation device under test, and removing the network characteristics of the reference frequency translation device from the measured network characteristics of the circuit.

12 Claims, 6 Drawing Sheets

METHOD OF MEASURING FREQUENCY TRANSLATION DEVICE

FIELD OF THE INVENTION

The present invention relates to a method for measuring the network characteristics of a frequency translation device by using a vector network analyzer.

DISCUSSION OF THE BACKGROUND ART

One important structural element in communication equipment or communication systems is a frequency translation device. A frequency translation device translates the frequency of some signal to another frequency as in a mixer or a sampler. If the network characteristics of a frequency translation device can be accurately measured, the communication equipment or communication system can be optimized. Until now, several methods for measuring the network characteristics of a frequency translation device have been proposed. These methods measure the network characteristics of a frequency translation device by using a vector network analyzer. Some methods require S21=S12 to be satisfied in the network characteristics of the frequency translation device, which is the device under test (see Unexamined Japanese Patent Publication No. 2002-57530 (pages 2-3, FIG. 1). Other methods require a special structure for the vector network analyzer (see Unexamined Japanese Patent Publication No. 2002-202,331 (pages 3-4, FIG. 1, FIG. 2). The special structure is a structure for measuring in the state with different source and receiver frequencies.

In the past few years, balanced input/balanced output frequency translation devices have become widely used. The network characteristics of a balanced input/balanced output frequency translation device can be measured by connecting a balun. However, in this measurement method, the network characteristics of the balun are included in the network characteristics of the frequency translation device. In addition, this measurement method cannot perform measurements related to the in-phase signal component.

The present invention is to provide a method for measuring the network characteristics of all frequency translation devices by using an ordinary vector network analyzer. In addition, the present invention will provide a method for accurately measuring the network characteristics of a balanced input/balanced output frequency translation device.

SUMMARY OF THE INVENTION

The present invention was developed to solve the above-mentioned problem. A method for measuring a frequency translation device under test by using a vector network analyzer and a reference frequency translation device, and comprises:

measuring the network characteristics of the abovementioned reference frequency translation device by using the abovementioned vector network analyzer, using the abovementioned vector network analyzer to measure the network characteristics of a circuit comprised of the above-mentioned reference frequency translation device and the above-mentioned frequency translation device under test wherein the above-mentioned reference frequency translation device has an operation complementary to the above-mentioned frequency translation device under test, and removing the network characteristics of the abovementioned reference frequency translation device from the measured network characteristics of the abovementioned circuit.

Moreover, the present invention generates a local signal input from the same signal source to the abovementioned reference frequency translation device and the abovementioned frequency translation device under test.

An additional embodiment according to the present invention pertains to a method for measuring a balanced input/balanced output frequency translation device under test by using a vector network analyzer, a first reference frequency translation device and a second reference frequency translation device that have unbalanced input/unbalanced output configurations, and comprises:

measuring the network characteristics of the abovementioned first reference frequency translation device by using the abovementioned vector network analyzer;

measuring the network characteristics of the abovementioned second reference frequency translation device by using the abovementioned vector network analyzer;

determining the phase difference between a first local signal in the abovementioned first reference frequency translation device and a second local signal in the abovementioned second reference frequency translation device;

synthesizing the network characteristics representing the abovementioned phase difference that was determined in the measured network characteristics of the abovementioned second reference frequency translation device;

measuring the network characteristics of a circuit comprised of the abovementioned first reference frequency translation device, the abovementioned second reference frequency translation device, and the abovementioned frequency translation device under test using the above-mentioned vector analyzer, wherein the abovementioned first reference frequency translation device and the abovementioned second reference frequency translation device have an operation complementary to the abovementioned frequency translation device under test; and removing the network characteristics of the abovementioned first reference frequency translation device and the synthesized network characteristics of the abovementioned second reference frequency translation device from the measured network characteristics of the abovementioned circuit.

The present invention also pertains to a circuit comprised of the abovementioned first reference frequency translation device and the abovementioned second reference frequency translation device as the abovementioned step for determining the phase difference, and includes a step that uses the abovementioned vector network analyzer to measure a circuit wherein the abovementioned first reference frequency translation device has an operation complementary to the abovementioned second reference frequency translation device.

A circuit comprised of the abovementioned first reference frequency translation device, the abovementioned second reference frequency translation device, and an added unbalanced input/unbalanced output frequency translation device as the abovementioned step for determining the phase, and comprises a step that uses the abovementioned vector network analyzer to measure the circuit wherein the abovementioned first reference frequency translation device and the abovementioned second reference frequency translation device have an operation complementary to the abovementioned added frequency translation device.

Furthermore, the present invention generates a local signal from the same signal source for input to the abovementioned first reference frequency translation device, the abovementioned second reference frequency translation device, and the abovementioned frequency translation device under test in the method of any one of the aforementioned.

The present invention also includes a program for executing the method of any one of the aforementioned embodiments in a computer for externally controlling a vector network analyzer or a vector network analyzer providing a computation means.

Another embodiment is a system for measuring a frequency translation device by performing the method of any one of the aforementioned embodiments.

According to the present invention, the network characteristics of all frequency translation devices can be measured by using an ordinary vector network analyzer. Compared to the prior art, according to the present invention, the number of reference frequency translation devices required for measuring is decreased. Furthermore, according to the present invention, the network characteristics of a balanced input/balanced output frequency translation device can be accurately measured. Furthermore, according to the present invention, a program is provided for measuring and storing the measurement results, such as the network characteristics of the reference frequency translation devices, in advance, for use in extracting the network characteristics of the frequency translation device under test. Consequently, the inconveniences to the tester, such as saving the parameters, are lessened, and measuring the network characteristics of the frequency translation device under test can be easily performed.

DETAILED DESCRIPTION OF THE PREFERRED EMBODIMENT

Preferred embodiments of the present invention are explained below with reference to the attached drawings. The first embodiment of the present invention is a vector network analyzer 100 for measuring an unbalanced input/unbalanced output frequency translation device.

Figure 1:
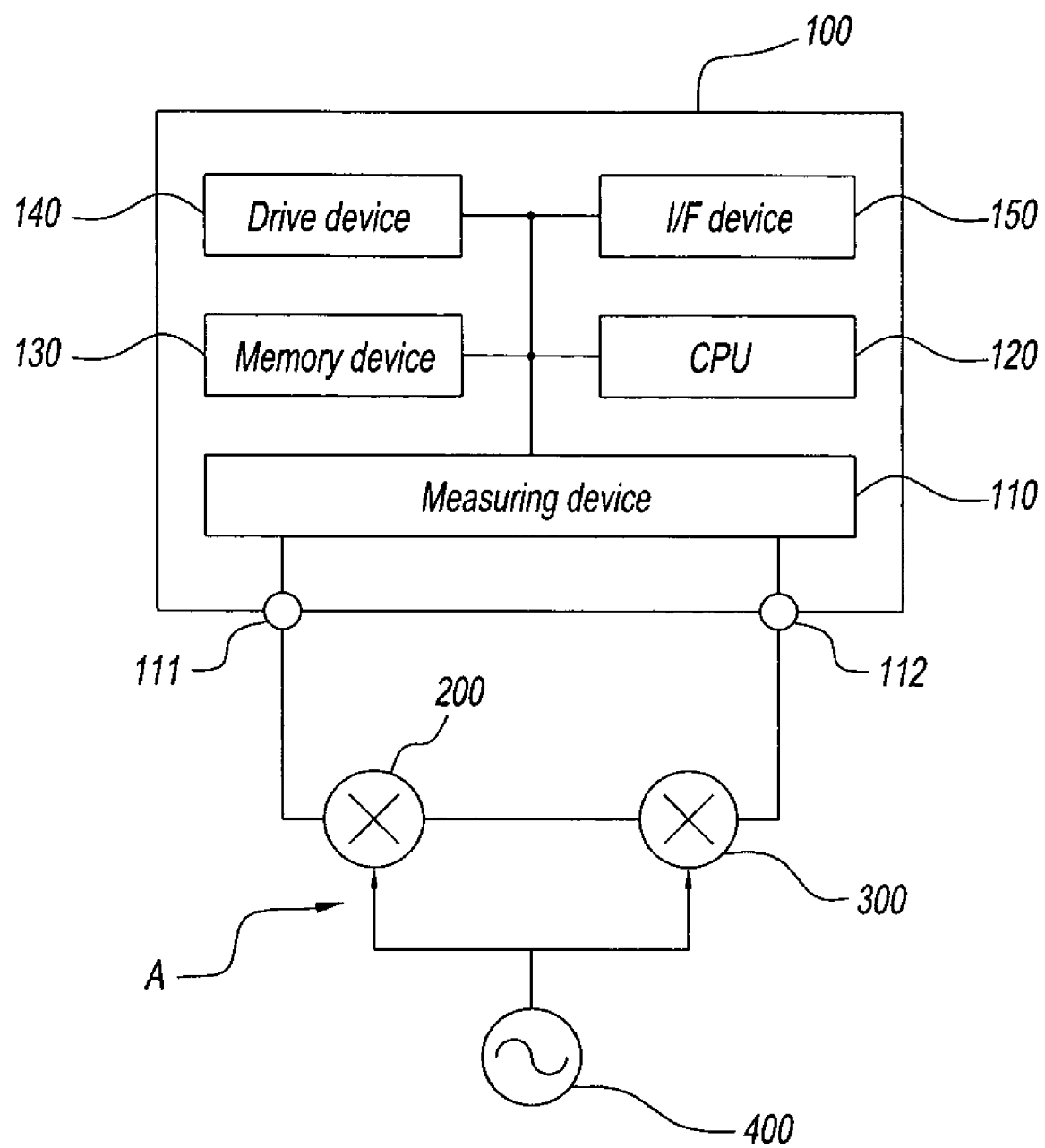
FIG. 1 illustrates the vector network analyzer 100 of the first embodiment.

Here, refer to FIG. 1. FIG. 1 illustrates the internal configuration of vector network analyzer 100. In FIG. 1, the vector network analyzer 100 is comprised of a measuring device 110, a central processing unit (CPU) 120, a memory device 130, a drive device 140, and an interface device 150. In this specification, the interface device is abbreviated as the I/F device and shown.

The measuring device 110 measures the network characteristics of the device under test connected through a port 111 or a port 112. The CPU 120 controls each structural element of the vector network analyzer 100 such as the measuring device 110. The memory device 130 stores data and programs. The drive device 140 can be read by a vector network analyzer 100 or an external computer and operates a removable recording medium. Data and programs are stored on the abovementioned recording medium. The interface device 150 outputs to the user, receives input from the user, and communicates with the external computer. For example, the interface device 150 includes a display and a keyboard, or a local area network (LAN) interface.

Figure 2:
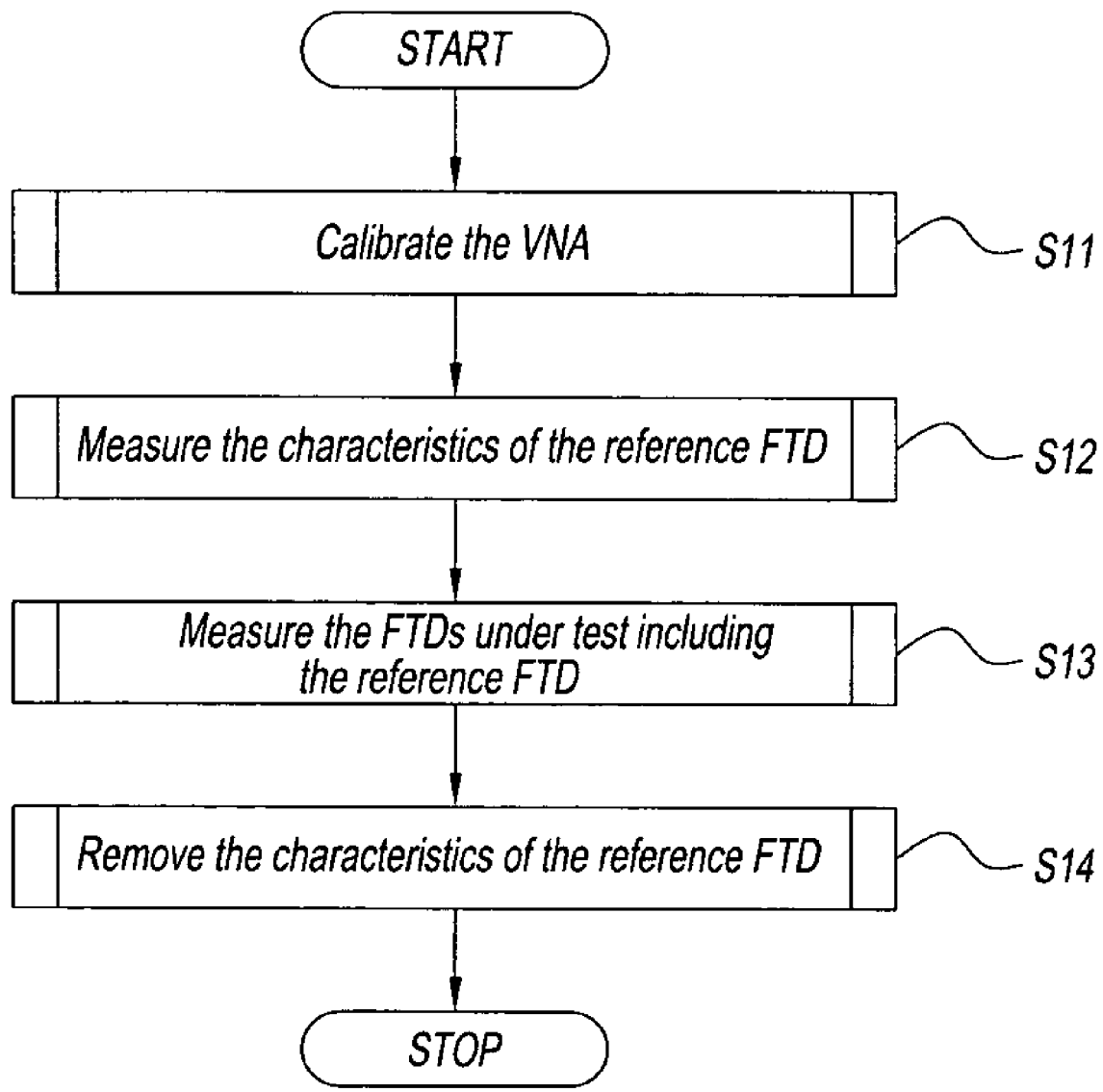
FIG. 2 is a flow chart illustrating the measurement procedure in the first embodiment.

Next, the procedure for measuring the network characteristics of a frequency translation device 200, which is the device under test, in the vector network analyzer 100 is explained. FIG. 2 is a flow chart illustrating the measurement procedure of the frequency translation device 200. The network characteristics of the frequency translation device 200 are measured by executing a program stored in the memory medium in the memory device 130 or the drive device 140, or under the control of an external computer (not shown) through the interface device 150. In this specification, the vector network analyzer is abbreviated as VNA and shown. Similarly, the frequency translation device is abbreviated as FTD and shown. Below, refer to FIGS. 1 and 2.

In step S11, the vector network analyzer 100 is calibrated. Since the number of ports used when measuring the network characteristics of the frequency translation device 200 is two, a full 2-port calibration is performed.

In step S12, the vector network analyzer 100 is used to measure the network characteristics of an unbalanced input/unbalanced output reference frequency translation device 300. The method for measuring the network characteristics of the reference frequency translation device is disclosed in Unexamined Japanese Patent Publication No. 2002-57530. The network characteristics of the reference frequency translation device 300 measured in this step are stored in memory device 130.

In step S13, as shown in FIG. 1, circuit A having reference frequency translation device 300 serially connected to frequency translation device 200 connects to the vector network analyzer 100. The vector network analyzer 100 is used to measure the network characteristics of series circuit A. Then the output signal of a signal source 400 is applied to frequency translation device 200 and reference frequency translation device 300 as the local signal. The local signal is the signal for manipulating the signal input to the frequency translation devices. For example, when the frequency translation device is a mixer, the local signal is input to the local terminal (LO terminal) of the mixer. When the frequency translation device is a sampler, the local signal is input to the control terminal (CTRL terminal) of the sampler. Then the frequency translation device 200 and the reference frequency translation device 300 have complementary operation in series circuit A. That is, if the frequency translation device 200 upconverts the signal passing through circuit A, reference frequency translation device 300 downconverts. Conversely, if frequency translation device 200 downconverts the signal passing through circuit A, reference frequency translation device 300 upconverts. Consequently, since series circuit A outputs a signal having the same frequency as the input signal, the vector network analyzer 100 is not provided with a special structure and can measure series circuit A.

In step S14, the network characteristics of reference frequency translation device 300 measured beforehand are read out of the memory device 130. Then the network characteristics of reference frequency translation device 300 are removed (de-embedded) from the network characteristics of series circuit A measured in step S13. The resulting network characteristics are output to the interface device 150 as the network characteristics of frequency translation device 200.

Next, a second embodiment of the present invention is explained. The second embodiment of the present invention is a vector network analyzer for measuring a balanced input/balanced output frequency translation device.

Figure 3:
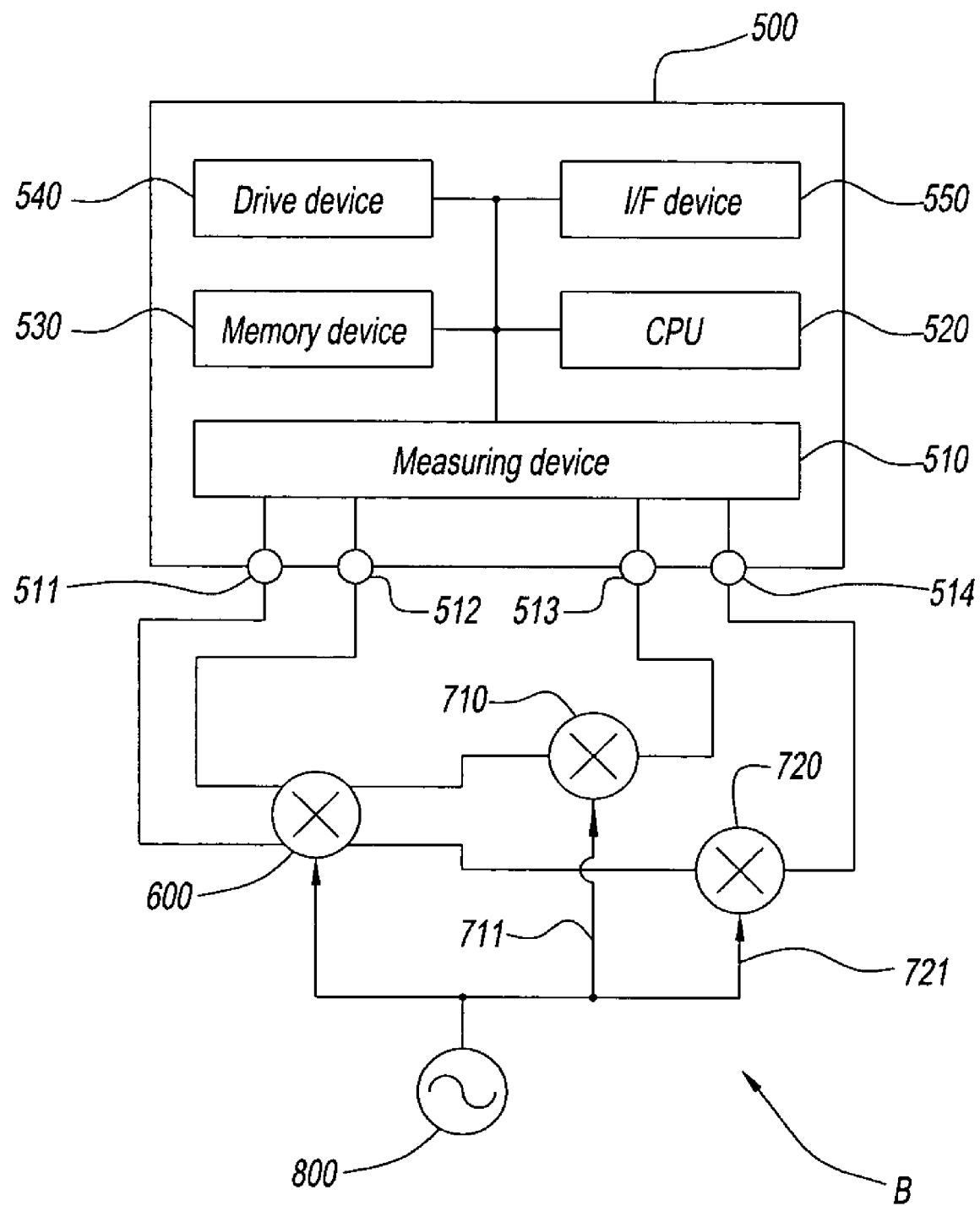
FIG. 3 illustrates the vector network analyzer 500 of the second embodiment.

Here, refer to FIG. 3. FIG. 3 illustrates the internal structure of a vector network analyzer 500. In FIG. 3, the vector network analyzer 500 is comprised of a measuring device 510, a CPU 520, a memory device 530, a drive device 540, and an interface device 550.

The measuring device 510 measures the network characteristics of the device under test connected through a port 511, a port 512, a port 513, or a port 514. CPU 520 controls each structural element of the vector network analyzer 500, such as the measuring device 510. The memory device 530 stores data and programs. The drive device 540 can be read by an external computer and vector network analyzer 500 and operates a removable recording medium. Data and programs are stored on the abovementioned recording medium. The interface device 550 outputs to the user, receives input from the user, and communicates with the external computer. For example, the interface device 550 includes a display and a keyboard, or a LAN interface.

Figure 4:
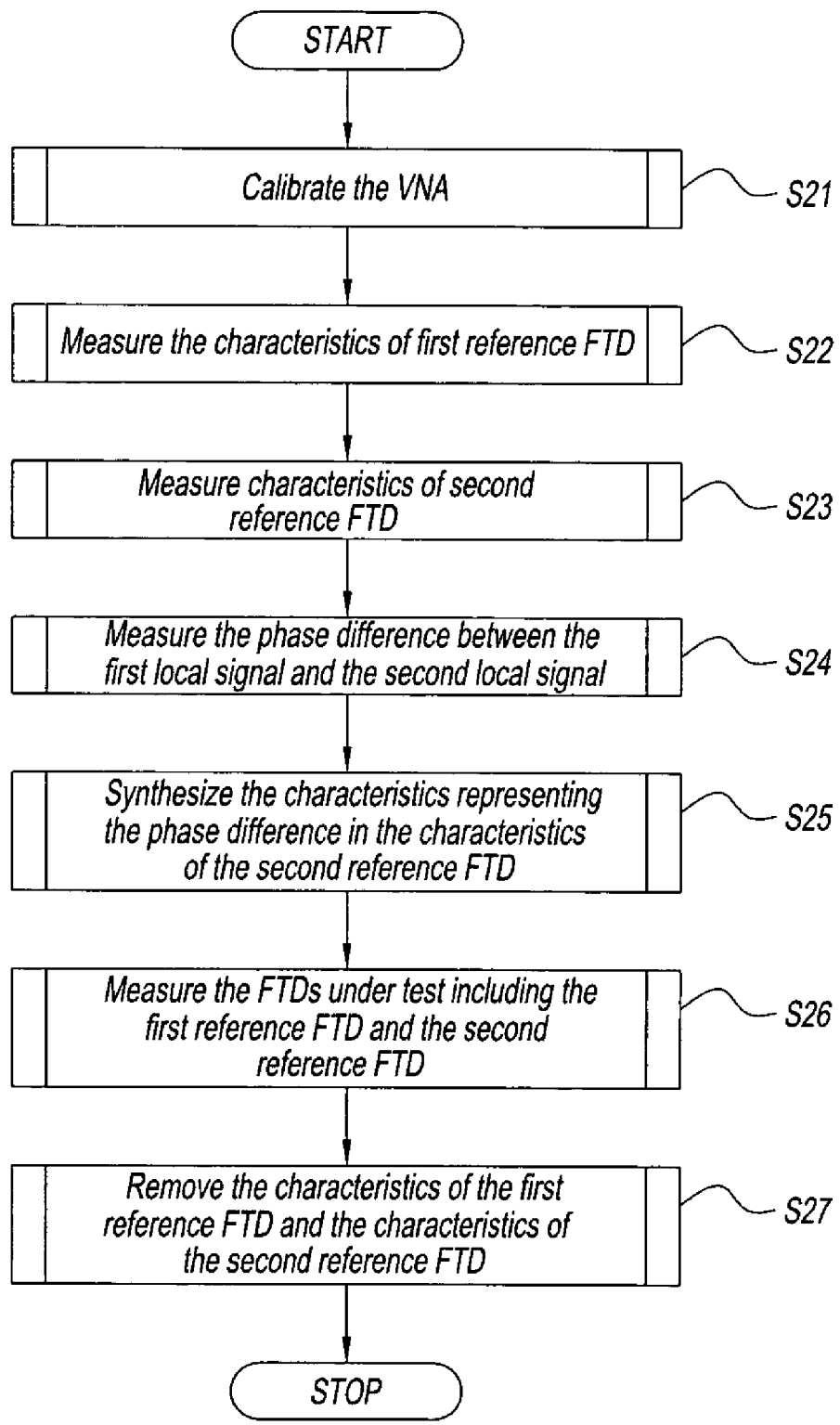
FIG. 4 is a flow chart illustrating the measurement procedure of the second embodiment.

Next, the procedure in the vector network analyzer 500 for measuring the network characteristics of a frequency translation device 600, which is the device under test, is explained. FIG. 4 is a flow chart illustrating the measurement procedure of the frequency translation device 600. The network characteristics of frequency translation device 600 are measured by executing a program stored in the recording medium in the memory device 530 or the drive device 540, or by control from the external computer (not shown) through the interface device 550. Below, refer to FIGS. 3 and 4.

In step S21, vector network analyzer 500 is calibrated. Since the number of ports used in the measurement of the network characteristics of frequency translation device 600 is four, a full 4-port calibration is performed.

In step S22, the vector network analyzer 500 is used to measure the network characteristics of an unbalanced input/unbalanced output reference frequency translation device 710. The method for measuring the network characteristics of the reference frequency translation device is disclosed in Unexamined Japanese Patent Publication No. 2002-57530. The network characteristics of reference frequency translation device 710 measured in this step are stored in memory device 530.

Similar to step S22, step S23 uses vector network analyzer 500 to measure the network characteristics of an unbalanced input/unbalanced output reference frequency translation device 720. The network characteristics of the reference frequency translation device 720 measured in this step are stored in memory device 530.

In step S24, vector network analyzer 500 is used to measure the phase difference between a local signal 711 applied to reference frequency translation device 710 and a local signal 721 applied to reference frequency translation device 720. The measured phase difference is stored in the memory device 530.

As shown in FIG. 3, when frequency translation device 600 is measured, reference frequency translation device 710 and reference frequency translation device 720 are connected to the balanced output of frequency translation device 600. At this time, if there is a phase difference between local signal 711 and local signal 721, a phase difference is produced between the output signal of reference frequency translation device 710 and the output signal of reference frequency translation device 720. Therefore, the network characteristics of frequency translation device 600 cannot be correctly determined. To correct this, the phase difference between local signal 711 and local signal 721 is measured beforehand.

Figure 5:
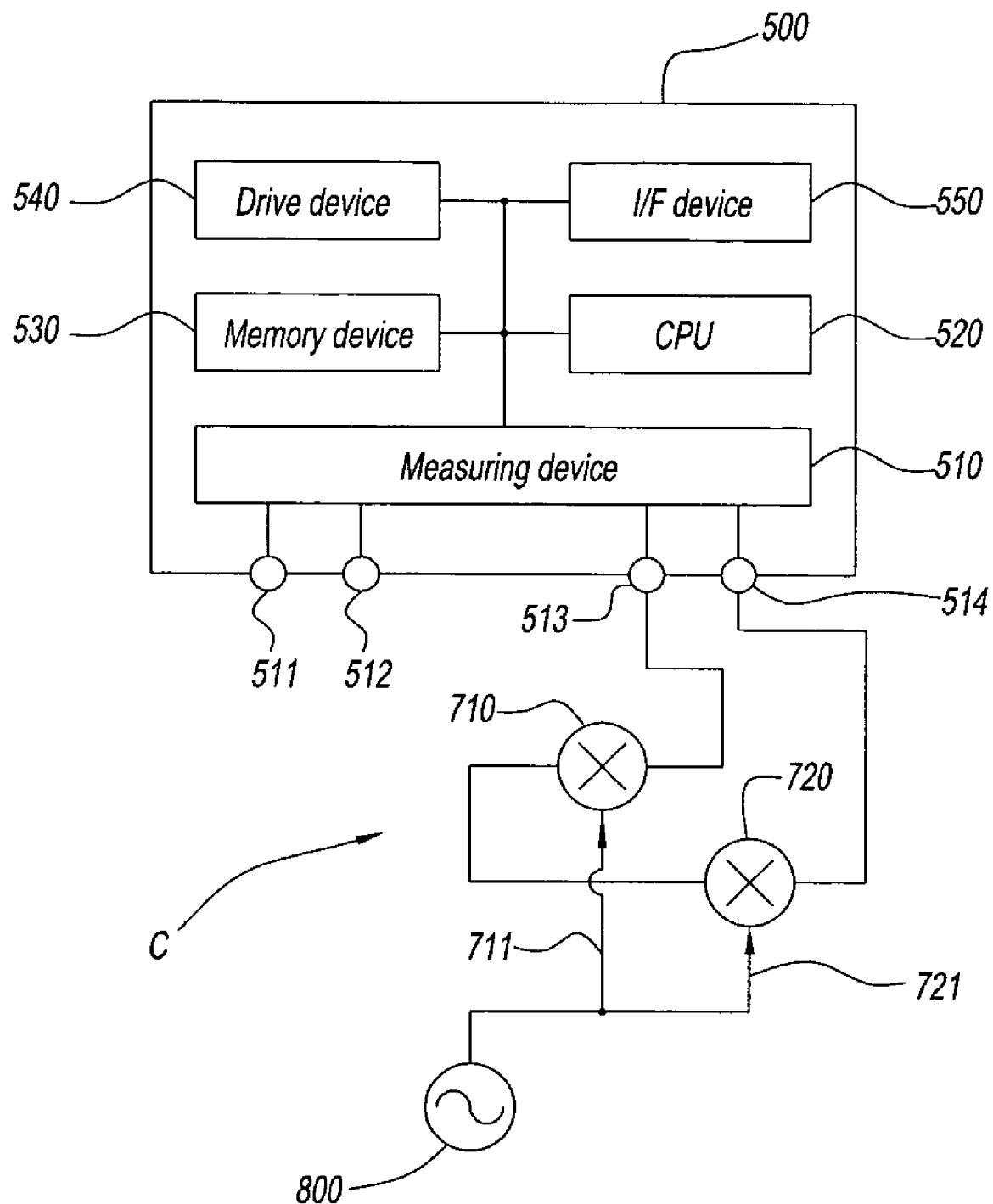
FIG. 5 illustrates the configuration for measuring the phase difference between the local signals.
Figure 6:
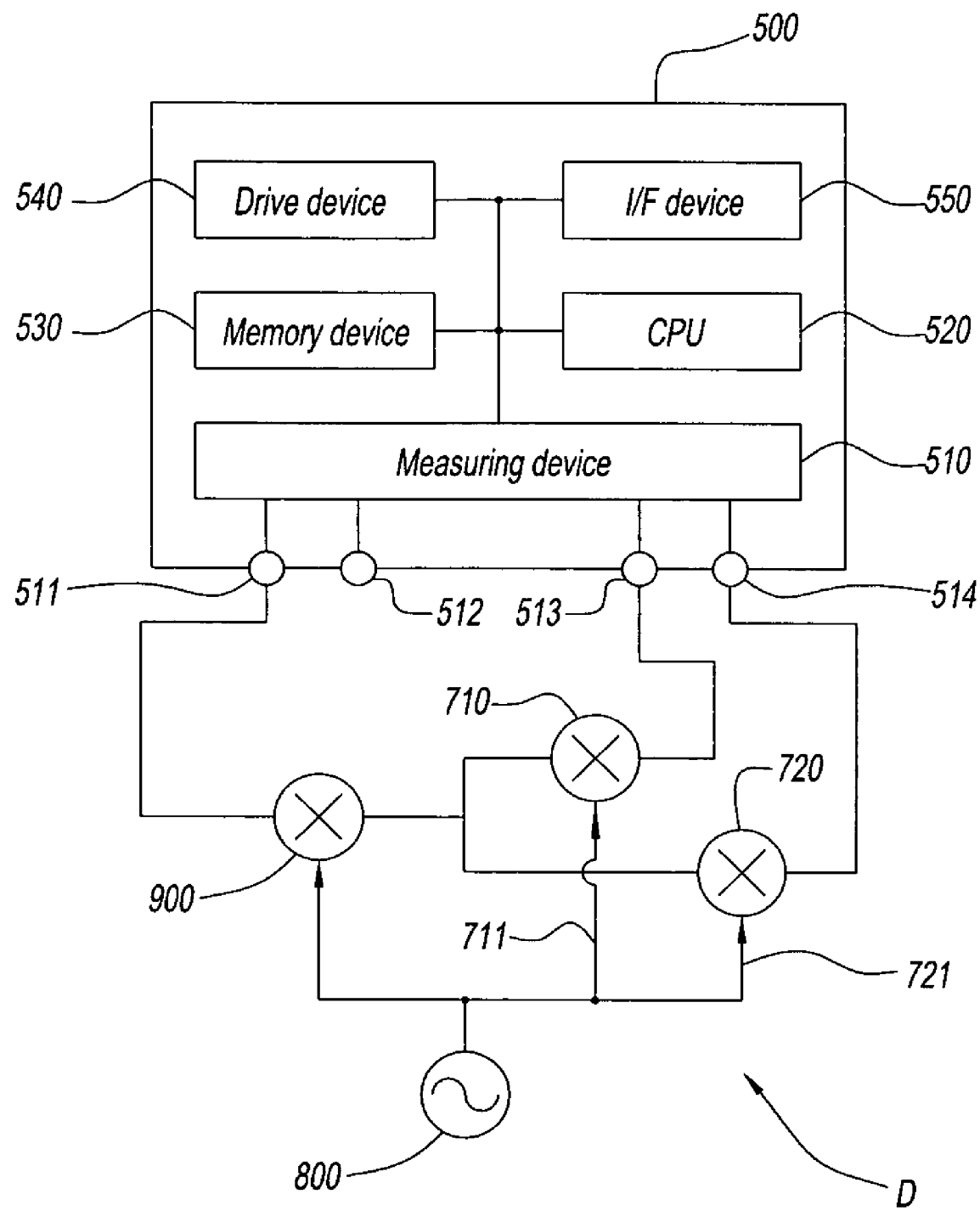
FIG. 6 illustrates the configuration for measuring the phase difference between the local signals.

For example, the phase difference between local signal 711 and local signal 721 is measured by the configurations as shown in FIGS. 5 and 6. In FIGS. 5 and 6, the same reference numbers are assigned to the same elements as in FIG. 3 and their descriptions are omitted.

Here, refer to FIG. 5. In the figure, reference frequency translation device 710 and reference frequency translation device 720 are serially connected to have complementary operation. In addition, the local terminals of reference frequency translation device 710 and reference frequency translation device 720 are connected to a signal source 800 to be in the same state as in FIG. 3. If reference frequency translation device 710 upconverts the signal passing through series circuit C comprised of reference frequency translation device 710 and reference frequency translation device 720, reference frequency translation device 720 downconverts. Conversely, if reference frequency translation device 710 downconverts the signal passing in series circuit C, reference frequency translation device 720 upconverts. Then bidirectional measurements (forward direction and reverse direction) are performed on series circuit C. At this time, the phase difference of the measured signal corresponds to twice the phase difference between local signal 711 and local signal 721. Let the phase difference between local signal 711 and local signal 721 be set to θ, and the S-parameters representing phase difference θ are represented by the following equation. The following equation can be converted to another parametric formula.

$$\begin{bmatrix} 0 & e^{j\theta} \\ e^{-j\theta} & 0 \end{bmatrix} \qquad \text{Equation 1}$$

Here, refer to FIG. 6. In this figure, reference frequency translation device 710 and reference frequency translation device 720 are connected to an added unbalanced input/unbalanced output frequency translation device 900 to have complementary operation. The network characteristics of frequency translation device 900 do not have to be known. The output signal of signal source 800 is applied to frequency translation device 900 as the local signal. Reference frequency translation device 710 and reference frequency translation device 720 are connected to signal source 800 to be in the same state as in FIG. 3, and the output signal of signal source 800 is applied as the local signal. In other words, if frequency translation device 900 upconverts the signal passing through circuit D comprised of reference frequency translation device 710, reference frequency translation device 720, and frequency translation device 900, reference frequency translation device 710 and reference frequency translation device 720 downconvert. Conversely, if frequency translation device 900 downconverts the signal passing through circuit D, reference frequency translation device 710 and reference frequency translation device 720 upconvert. Then the measurement signal is applied to frequency translation device 900, and circuit D is measured. The result is that the phase difference θ between the output signal of reference frequency translation device 710 and the output signal of reference frequency translation device 720 is measured. The S-parameters representing the phase difference θ are expressed by the above equation.

Again referring to FIGS. 3 and 4, in step S25, the network characteristics representing the phase difference obtained in step S24 (for example, the S-parameters in the above equation) are synthesized in the network characteristics of reference frequency translation device 720 obtained in step S23.

The synthesized network characteristics of reference frequency translation device 720 are stored in memory device 530.

As shown in FIG. 3, in step S26, circuit B comprised of reference frequency translation device 710, reference frequency translation device 720, and frequency translation device 600 are connected to vector network analyzer 500. Then vector network analyzer 500 is used to measure the network characteristics of circuit B. The output signal of signal source 800 is applied to reference frequency translation device 710, reference frequency translation device 720, and frequency translation device 600 as the local signal. In circuit B, reference frequency translation device 710 and reference frequency translation device 720 have an operation complementary to frequency translation device 600. In other words, if frequency translation device 600 upconverts the signal passing through circuit B, reference frequency translation device 710 and reference frequency translation device 720 downconvert. Conversely, if frequency translation device 600 downconverts the signal passing through circuit B, reference frequency translation device 710 and reference frequency translation device 720 upconvert. Consequently, circuit B outputs a signal having the same frequency as the input signal, and vector network analyzer 500 is not provided with a special configuration and can measure circuit B.

In step S27, the network characteristics of reference frequency translation device 710 measured in advance and of reference frequency translation device 720 synthesized in step S25 are read out of memory device 530. Then the network characteristics of reference frequency translation device 710 and the synthesized network characteristics of reference frequency translation device 720 are removed (de-embedded) from the network characteristics of circuit B measured in step S26. The resulting network characteristics are output to interface device 550 as the network characteristics of frequency translation device 600.

In the above embodiments, the following modifications are possible. In the above embodiments, the vector network analyzer can provide at least several ports required in the measurements. Consequently, vector network analyzer 100 can have at least three ports. Vector network analyzer 500 can have at least five ports.

In the first and second embodiments, the local signals applied to the frequency translation device do not have to be generated by the same source signal. If the local signals applied to the frequency translation devices have the same frequencies, they may be generated by different signal sources.

In the above embodiments, the measurements of the network characteristics and the measurement of the phase difference between the local signals of the reference frequency translation devices can be stored in locations other than the memory device in the vector network analyzer. For example, the measurements can be stored in the memory of the computer connected externally to the vector network analyzer.

What is claimed is:

1. A method for measuring a balanced input/balanced output frequency translation device under test by using a vector network analyzer and a first reference frequency translation device and a second reference frequency translation device, which are unbalanced input/unbalanced output frequency translation devices, said method comprises:

measuring the network characteristics of said first reference frequency translation device by using said vector network analyzer;

measuring the network characteristics of said second reference frequency translation device by using said vector network analyzer;

determining the phase difference between a first local signal for said first reference frequency translation device and a second local signal for said second reference frequency translation device;

synthesizing the network characteristics representing said phase difference that was determined in the measured network characteristics of said second reference frequency translation device;

measuring the network characteristics of a circuit comprised of said first reference frequency translation device, said second reference frequency translation device, and said frequency translation device under test using the vector network analyzer, wherein said first reference frequency translation device and said second reference frequency translation device have an operation complementary to said frequency translation device under test;

removing the network characteristics of said first reference frequency translation device and the synthesized network characteristics of said second reference frequency translation device from the measured network characteristics of said circuit; and outputting a removal result.

2. The method according to claim 1, wherein said step for determining the phase difference comprises:

measuring the circuit comprised of said first reference frequency translation device and said second reference frequency translation device using said vector network analyzer, wherein said first reference frequency translation device has an operation complementary to said second reference frequency translation device.

3. The method according to claim 1, wherein said step for determining the phase difference comprises:

measuring a circuit comprised of said first reference frequency translation device, said second reference frequency translation device, and an added unbalanced input/unbalanced output frequency translation device using said vector network analyzer, wherein said first reference frequency translation device and said second reference frequency translation device have an operation complementary to said added frequency translation device.

4. The method according to claim 1, wherein the local signals input to said first reference frequency translation device, said second reference frequency translation device, and said frequency translation device under test are generated by the same signal source.

5. A computer program embedded in a computer readable medium for executing a method for measuring a balanced input/balanced output frequency translation device under test by using a vector network analyzer and a first reference frequency translation device and a second reference frequency translation device, which are unbalanced input/unbalanced output frequency translation devices, said method comprises:

measuring the network characteristics of said first reference frequency translation device by using said vector network analyzer;

measuring the network characteristics of said second reference frequency translation device by using said vector network analyzer;

determining the phase difference between a first local signal for said first reference frequency translation device and a second local signal for said second reference frequency translation device;

synthesizing the network characteristics representing said phase difference that was determined in the measured network characteristics of said second reference frequency translation device;

measuring the network characteristics of a circuit comprised of said first reference frequency translation device, said second reference frequency translation device, and said frequency translation device under test using the vector network analyzer, wherein said first reference frequency translation device and said second reference frequency translation device have an operation complementary to said frequency translation device under test;

removing the network characteristics of said first reference frequency translation device and the synthesized network characteristics of said second reference frequency translation device from the measured network characteristics of said circuit; and outputting a removal result.

6. A system for measuring frequency translation devices by a method for measuring a balanced input/balanced output frequency translation device under test by using a vector network analyzer and a first reference frequency translation device and a second reference frequency translation device, which are unbalanced input/unbalanced output frequency translation devices, said method comprises:

measuring the network characteristics of said first reference frequency translation device by using said vector network analyzer;

measuring the network characteristics of said second reference frequency translation device by using said vector network analyzer;

determining the phase difference between a first local signal for said first reference frequency translation device and a second local signal for said second reference frequency translation device;

synthesizing the network characteristics representing said phase difference that was determined in the measured network characteristics of said second reference frequency translation device;

measuring the network characteristics of a circuit comprised of said first reference frequency translation device, said second reference frequency translation device, and said frequency translation device under test using the vector network analyzer, wherein said first reference frequency translation device and said second reference frequency translation device have an operation complementary to said frequency translation device under test;

removing the network characteristics of said first reference frequency translation device and the synthesized network characteristics of said second reference frequency translation device from the measured network characteristics of said circuit; and outputting a removal result.

7. A method for measuring a balanced input/balanced output frequency translation device under test by using a vector network analyzer and a first reference frequency translation device and a second reference frequency translation device, wherein the first and second reference frequency translation devices are unbalanced input/unbalanced output frequency translation devices and have an operation complementary to the frequency translation device under test, the method comprising:

applying a first signal to the first reference frequency translation device;

applying a second signal to the second reference frequency translation device;

determining a phase difference between the first and second signals;

synthesizing network characteristics representing the phase difference in network characteristics of the second reference frequency translation device;

applying a third signal to the frequency translation device under test; and measuring network characteristics of a circuit comprising the first and second reference frequency translation devices and the frequency translation device under test using the vector network analyzer;

removing network characteristics of the first reference frequency translation device and the synthesized network characteristics of the second reference frequency translation device from the measured network characteristics of the circuit; and outputting a removal result.

8. The method according to claim 7, wherein determining a phase difference between the first and second signals comprises:

measuring a circuit comprised of the first reference frequency translation device and the second reference frequency translation device using the vector network analyzer, wherein the first reference frequency translation device has an operation complementary to the second reference frequency translation device.

9. The method according to claim 7, wherein determining a phase difference between the first and second signals comprises:

measuring a circuit comprised of the first reference frequency translation device, the second reference frequency translation device, and an added unbalanced input/unbalanced output frequency translation device using the vector network analyzer, wherein the first reference frequency translation device and the second reference frequency translation device have an operation complementary to the added frequency translation device.

10. The method according to claim 7, wherein the first, second, and third signals are generated by the same signal source.

11. A computer program embedded in a computer readable medium for executing a method for measuring a balanced input/balanced output frequency translation device under test by using a vector network analyzer and a first reference frequency translation device and a second reference frequency translation device, wherein the first and second reference frequency translation devices are unbalanced input/unbalanced output frequency translation devices and have an operation complementary to the frequency translation device under test, the method comprising:

applying a first signal to the first reference frequency translation device;

applying a second signal to the second reference frequency translation device;

determining a phase difference between the first and second signals;

applying a third signal to the frequency translation device under test;

measuring network characteristics of a circuit comprising the first and second reference frequency translation devices and the frequency translation device under test using the vector network analyzer;

removing network characteristics of the first reference frequency translation device and the synthesized network characteristics of the second reference frequency translation device from the measured network characteristics of the circuit; and outputting a removal result.

12. A system for measuring frequency translation devices by a method for measuring a balanced input/balanced output frequency translation device under test by using a vector network analyzer and a first reference frequency translation device and a second reference frequency translation device, wherein the first and second reference frequency translation devices are unbalanced input/unbalanced output frequency translation devices and have an operation complementary to the frequency translation device under test, the method comprising:

applying a first signal to the first reference frequency translation device;

applying a second signal to the second reference frequency translation device;

determining a phase difference between the first and second signals;

synthesizing network characteristics representing the phase difference in network characteristics of the second reference frequency translation device;

applying a third signal to the frequency translation device under test;

measuring network characteristics of a circuit comprising the first and second reference frequency translation devices and the frequency translation device under test using the vector network analyzer;

removing network characteristics of the first reference frequency translation device and the synthesized network characteristics of the second reference frequency translation device from the measured network characteristics of the circuit; and outputting a removal result.

\* \* \* \* \*